(12) United States Patent
Kosugi

(10) Patent No.: US 6,582,085 B2
(45) Date of Patent: Jun. 24, 2003

(54) SEMICONDUCTOR CHIP AND ITS MANUFACTURING METHOD

(75) Inventor: Ryuichi Kosugi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,178

(22) Filed: Nov. 19, 2001

(65) Prior Publication Data

US 2002/0192928 A1 Dec. 19, 2002

(30) Foreign Application Priority Data

Jun. 13, 2001 (JP) .......................... 2001-178533

(51) Int. Cl.[7] ...................... H01L 23/58; H01L 25/5544

(52) U.S. Cl. ........................................ 357/48; 257/620

(58) Field of Search .................. 257/622, 48, 618, 257/620, 798; 430/110, 113, 114, 460, 461, 462, 464, 465

(56) References Cited

U.S. PATENT DOCUMENTS

| | | | | | |
|---|---|---|---|---|---|
| 4,890,383 | A | * | 1/1990 | Lumbard et al. | 29/841 |
| 5,047,711 | A | * | 9/1991 | Smith et al. | 324/158 R |
| 5,477,062 | A | * | 12/1995 | Natsume | 257/48 |
| 5,923,047 | A | * | 7/1999 | Chia et al. | 257/48 |
| 5,942,766 | A | * | 8/1999 | Frei | 257/48 |
| 6,121,677 | A | * | 9/2000 | Song et al. | 257/692 |
| 6,291,835 | B1 | * | 9/2001 | Tsuji et al. | 257/48 |
| 6,404,217 | B1 | * | 6/2002 | Gordon | 324/763 |
| 6,410,936 | B1 | * | 6/2002 | Hongo | 257/48 |
| 6,462,401 | B2 | * | 10/2002 | Fujii | 257/620 |

* cited by examiner

*Primary Examiner*—Kamand Cuneo
*Assistant Examiner*—Scott B. Geyer
(74) *Attorney, Agent, or Firm*—McDermott, Will & Emery

(57) ABSTRACT

A silicon wafer has a plurality of chip portions and a plurality of street portions. Each of the street portions runs and spaces between neighboring chip portions. The wafer also has circuits each provided on the street portions. The circuit is reinforced by a reinforcing portion. The reinforcing portion is provided on the circuit before dicing and then cut out in part by dicing so that it remains in part on at least one end portion of the circuit, adjacent to the chip portions, after dicing.

2 Claims, 6 Drawing Sheets

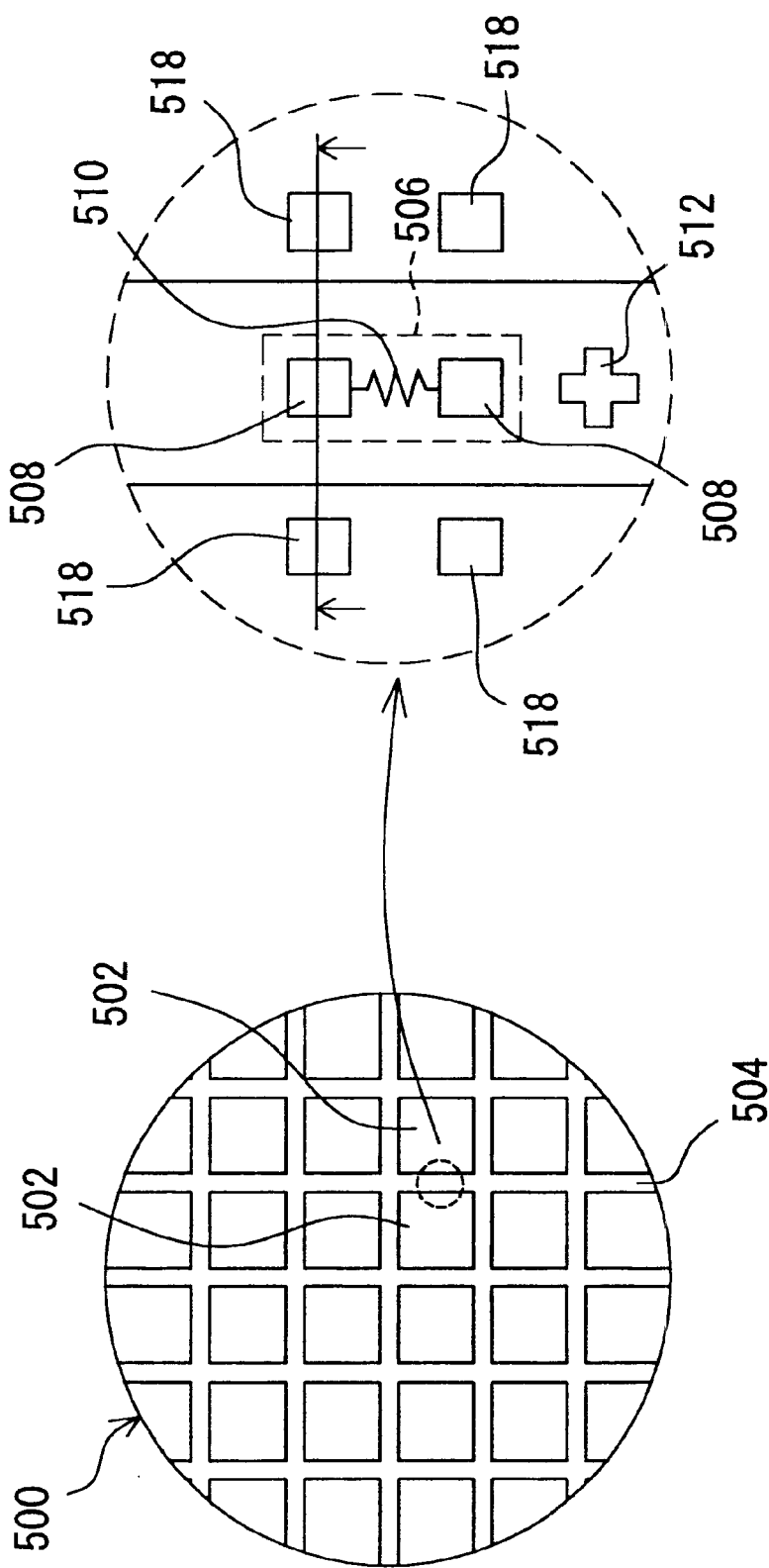

SEMICONDUCTOR CHIP AND ITS MANUFACTURING METHOD

RELATED APPLICATIONS

The present application is based upon Japanese Patent Application No. 2001-178533 which is entirely incorporated herein by reference.

FIELD OF THE INVENTION

The present invention relates to a semiconductor chip and its manufacturing method. Also, the present invention relates to a silicon wafer for use in a process of manufacturing the semiconductor chip.

BACKGROUND OF THE INVENTION

Generally, according to a process for manufacturing semiconductor devices, a silicon wafer is formed with a number of chip portions divided by a number of street portions running and spacing between the neighboring chip portions. A conventional semiconductor manufacturing process is applied to the chip portions to produce semiconductor chips. The silicon wafer is then cut and separated by dicing along the street portions into small semiconductor chips. Each of the separated semiconductor chips is packaged and then provided to a final test in which features of the semiconductor chip are evaluated.

In addition to the final test, before being separated by dicing, each of the semiconductor chips is tested by the use of an associated electric circuit, i.e., test element group (TEG), formed on the neighboring street in order to detect any defect in the semiconductor chip. This prevents the defective semiconductor chips from not only being packaged but also being subject to the final test. Besides, in each of manufacturing processes, mask alignments are performed by the use of indications or marks provided on the streets.

For example, as shown in FIG. 5A the silicon wafer 500 is defined with a number of chip portions 502 defined by vertical and horizontal streets 504. Also, as shown in FIG. 5B, a part of the street portion 504 positioned between the neighboring chip portions 502 bears an electric circuit such as resistor circuit 506. The circuit 506 includes a pair of probe pads 508 and a resistance wire 510 running between the probe pads 508, for example. In this circuit, an amount of resistance in the circuit 506 varies with a width and thickness of resistance wire formed therein. The size, i.e., width and thickness, of the resistance wire varies with a manufacturing precision of the semiconductor chips. This in turn means that the manufacturing precision of the regions adjacent to the circuit 506 can be evaluated from the amount of resistance of the wire 510. In addition to the circuit 506, an indication 512 is provided on the street portion which is used to determine a misalignment of each mask used in the manufacturing of the silicon wafer.

After the evaluation, the silicon wafer 500 is cut into semiconductor chips along centerlines of respective street portions 504, which is illustrated in FIGS. 6A–6C. As can be seen from FIG. 6A, the probe pad 508 made of aluminum is supported on the street portion 504 through an insulation layer 501 provided between the street portion 504 and the probe pad 508/ A dicer 514, which is a notable diamond-cut disc, is used for cutting the silicon wafer 500. In the drawing, respective parts of the street portion 504, the probe pad 508 and insulation layer 501, cut out by the dicer 514, are defined between the dotted lines 516. As shown in FIG. 6B, each bonding pad 518 on the separated semiconductor chip 513 including the chip portion and a remaining of the street portion 504 is connected with a corresponding terminal 520 on a package (not shown) through a bonding wire 522 extending in the form of arch between the bonding pad 518 and the terminal 520.

Disadvantageously, as shown in FIGS. 6B and 6C, the dicing can result in a creation of burrs 524 at the cut edge of a remaining part 526 of the probe pad 508. In this instance, as shown in FIG. 6B, if the wire 522 is extended as it draws a high arch, no physical contact would be made between the wire 522 and the burr 524. Otherwise, as shown in FIG. 6C, the wire 522 makes a contact with the burr 524, which results in an unwanted leakage of electric current. Also, the wire 522 is electrically connected to another wire through burrs and remaining parts 526 of the probe pads 508, which results in a malfunction of the semiconductor chip.

SUMMARY OF THE INVENTION

Therefore, an object of the present invention is to provide an improved semiconductor chip and silicone wafer, and a method for manufacturing the semiconductor, capable of eliminating or minimizing a creation of burrs.

To this end, a semiconductor chip which is manufactured by preparing a silicon wafer having a plurality of chip portions and a plurality of street portions each running and spacing between neighboring chip portions, each of the street portions bearing a circuit, and cutting out a central portion of each of the street portion by dicing while remaining either or both of end portions of the circuit adjacent to the chip portions, comprises a reinforcing portion, the reinforcing portion being provided on the circuit before the dicing and then cut out in part by dicing so that it remains in part on the remaining end portion of the circuit after dicing.

Also, a silicon wafer of the present invention has a plurality of chip portions, a plurality of street portions, each of the street portions running and spacing between neighboring chip portions, circuits provided on the street portions, and reinforcing portions. Each of the reinforcing portions is provided on each of the circuits before dicing and then cut out in part by dicing so that it remains in part on at least one end portion of the circuit, adjacent to the chip portions, after dicing.

Further, a method for manufacturing a semiconductor chip, comprises preparing a silicon wafer having a plurality of chip portions and a plurality of street portions each running and spacing between neighboring chip portions, each of the street portions bearing a circuit and a reinforcing portion on the circuit, and cutting out a central portion of each of the street portions by dicing while remaining at least one end portion of the circuit, adjacent to the chip portion, and the reinforcing portion on the one end portion of the circuit.

BRIEF DESCRIPTION OF THE DRAWINGS

FIG. 5A is a partial, enlarged plan view of a conventional silicon wafer;

FIG. 5B is a partial, enlarged plan view of a street portion of the silicon wafer in FIG. 5A;

DETAILED DESCRIPTION OF THE PREFERRED EMBODIMENTS

Figure 1A:
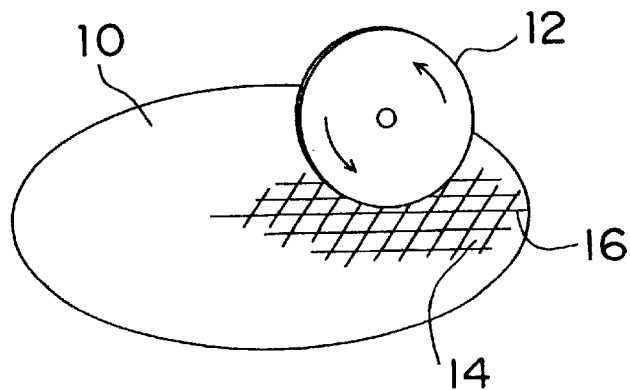
FIG. 1A is a schematic perspective view of a silicon wafer according to a first embodiment of the present invention and a dicer for cutting the silicon wafer.

With reference to the drawings, several embodiments of the present invention will be described in detail hereinafter. It should be noted that like reference numerals designate like parts throughout the drawings.

First Embodiment

Figure 1B:
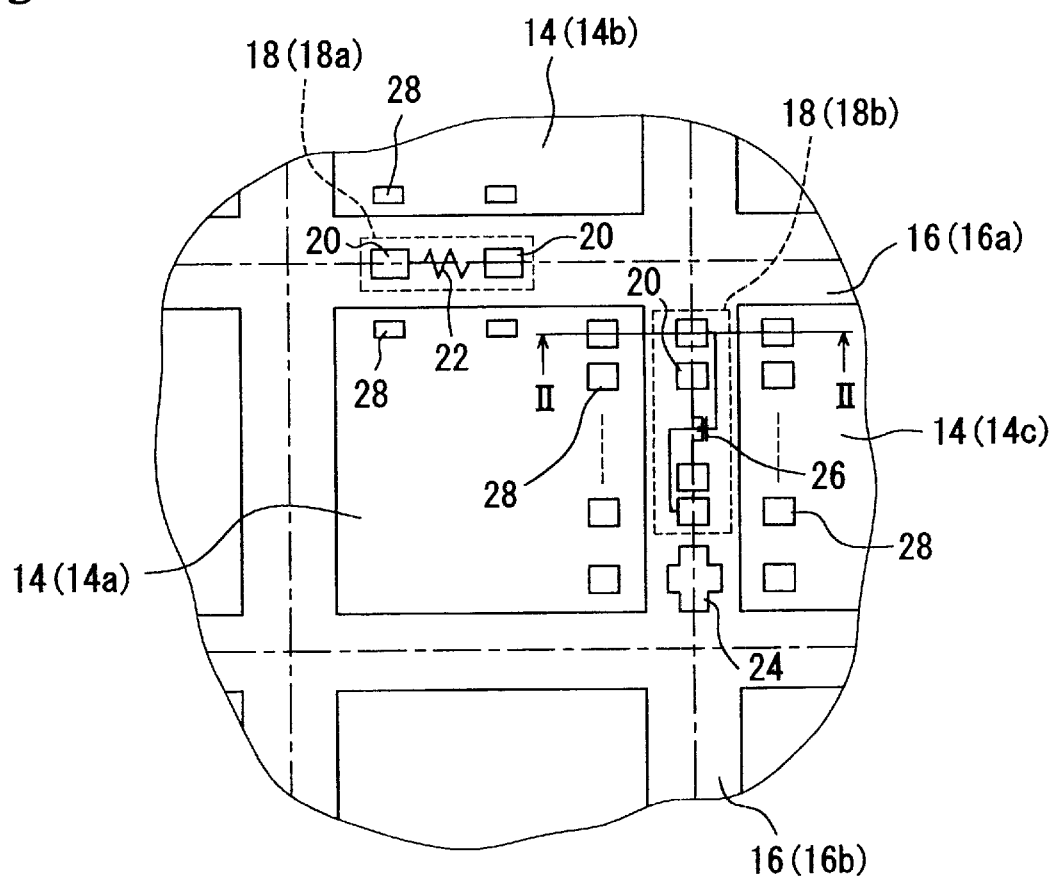
FIG. 1B is a partial, enlarged plan view of the silicon wafer showing chip portions and street portions.

Referring to FIG. 1A, there is shown a silicon wafer 10 and a dicer 12 for cutting the silicon wafer 10 into small semiconductor chips. Referring to FIG. 1B, there is shown an enlarged part of the silicon wafer 10 before being cut by the dicer 12. The silicon wafer 10 has a number of semiconductor chip portions 14 and a number of street portions 16 extending horizontally and vertically between the chip portions 14. In this drawing, the street portion 16a extending between the chip portions 14a and 14b supports a first test element group (TEG) or resistor circuit 18a. The circuit 18a has a pair of probe pads 20 and a resistance wire 22 electrically connecting between the paired probe pads 20. Another street portion 18b extending between the chip portions 14a and 14c supports a second test element group (TEG) or transistor circuit 18b and an indication 24 for a mask alignment. The circuit 18b has a transistor 26 and its four probe pads 20. Each of the chip portions bears one or more bonding pads along its periphery. For example, the chip regions 14a and 14b support bonding pads 28 adjacent to the circuit 18a on the street portion 16a. Also, the chip regions 14a and 14c support boding pads 28 adjacent to the circuit 18b on the street portion 16b.

In this instance, the cutting along the street portions 16 by dicers can cause burrs at the cut edges of the remaining portions of the probe pads 20 in the circuits 18 as described above. The large burr would make a contact with a wire extending from the bonding pad. However, according to the present invention, the probe pads on the street portions are reinforced in order to prevent the burr from making contact with the wire, which will be discussed in detail hereinafter.

Figure 2A:
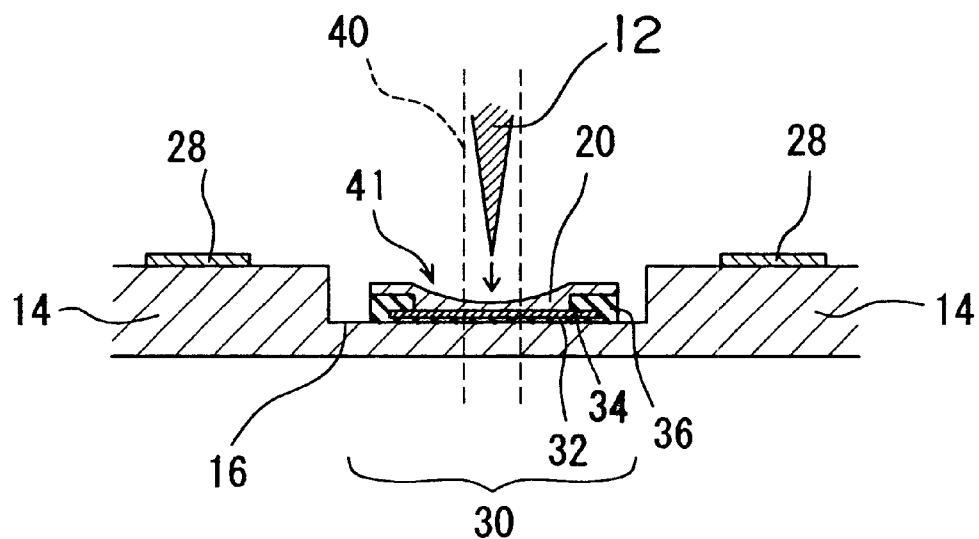
FIG. 2A is an enlarged cross sectional view of the street portion and a circuit mounted on the street portion.
Figure 2B:
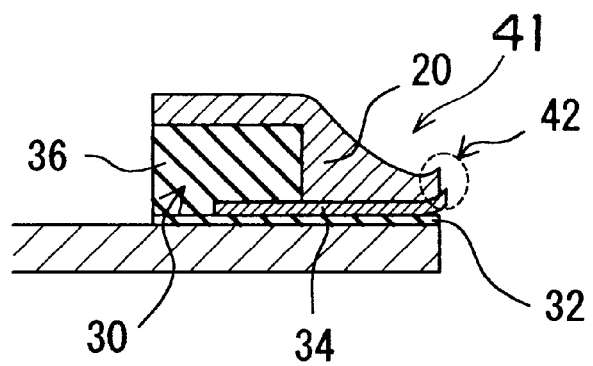
FIG. 2B is an enlarged cross sectional view of a reinforcing support for reinforcing the probe pad.

Referring to FIG. 2A, the probe pad 20 is mounted on a reinforcing portion or support 30. As best shown in FIG. 2B, the reinforcing support 30 has a lower insulation layer 32, an intermediate metal layer 34, and upper insulation layers 36.

The lower insulation layer 32, which is made of a suitable insulation material, is mounted on the street portion 16 of the silicon wafer 10. The intermediate conductive, metal layer 34 is mounted on the lower insulation layer 32. Also, the lower insulation layer 32 and the metal layer 34 are sized so that the opposite ends of the lower insulation layer 32 project from the corresponding side edges of the metal layer 34. Each of upper insulation layers 36 is mounted on the edges of the lower insulation layer 32 and the intermediate metal layer 34, leaving a channel or recess therebetween. Also, a width of the opposing upper insulation layers 36 is larger than a cutting region of a dicer 12, defined between dotted lines 40 in FIG. 2A.

Referring again to FIG. 2B, the probe pad 20 is provided so that it covers the intermediate metal layer 34 and the upper insulation layers 36. A thickness of the probe pad 20 varies on the intermediate metal layer 34 so that a surface of the probe pad 20 draws a bathtub curve or concave to define a channel 41 between the upper insulation layers 36. The channel 41 has a width greater than the cutting region of the dicer 12.

With the arrangement, the downward curved portion of probe pad 20 effectively disperses a cutting force received from the dicer 12 without concentrating at the cut edges of the probe pad 20. Also, the probe pad 20 is well supported by the intermediate metal layer 34. Further, the probe pad 20 has a large thickness near the upper insulation layers 36. Furthermore, the intermediate metal layer 34 is well supported by and between the lower and upper insulation layers 32 and 36. This allows the reinforcing support 30 to well resist the cutting force to minimize the deformation of the edge the probe pad 20, which effectively prevents a creation of large burrs as shown in FIG. 2B.

Figure 2C:
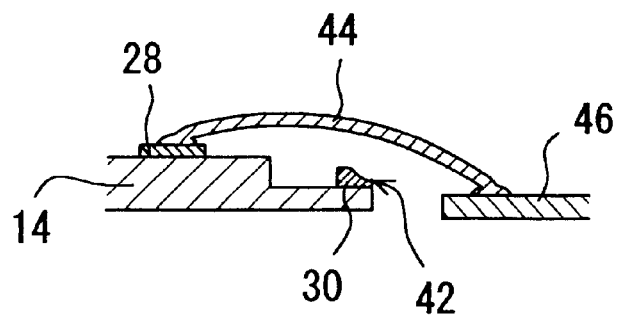
FIG. 2C is an enlarged cross sectional view of the separated chip portion and a connection between a bonding pad and a lead by a bonding wire.

Therefore, as shown in FIG. 2C, since the burr 42, if any, formed at the cut edge of the probe pad 20 is so small that no contact will be made between the burr 42 and the wire 44 extending across and above the burr 42 for the connection between the bonding pad 28 and a lead 46. This in turn allows the wire 44 to be lowered, ensuring that the chip package for receiving the semiconductor chip is thinned and then minimized.

Preferably, the reinforcing support 30 is positioned away from the chip portions 14 so that only a small part of vibrations generated at dicing is transmitted to the chip portions 14, ensuring a proper operation of the semiconductor chips.

Figure 3A:
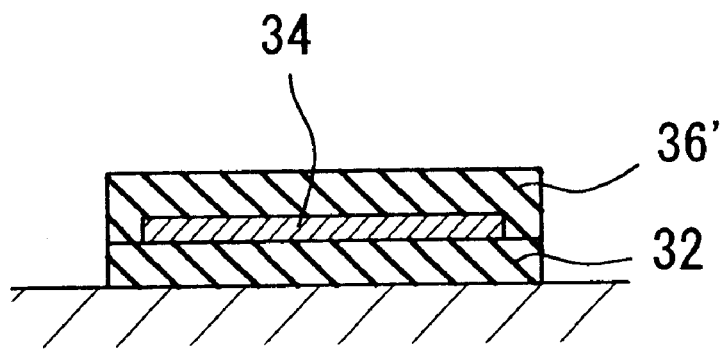
FIGS. 3A to 3C are enlarged cross sectional views showing a process of manufacturing the reinforcing support and the probe pad.
Figure 3B:
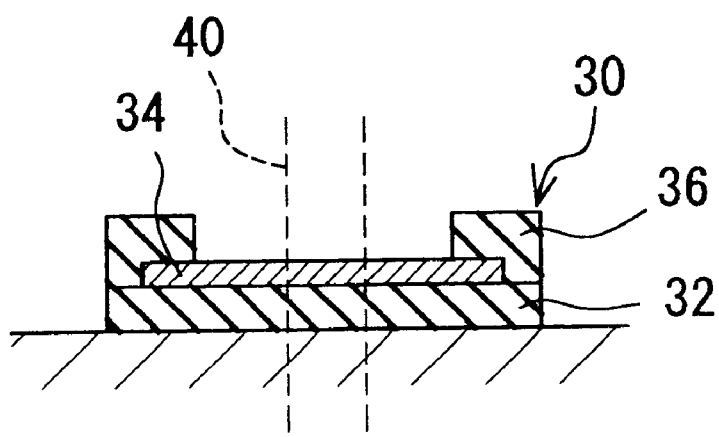
Figure 3C:
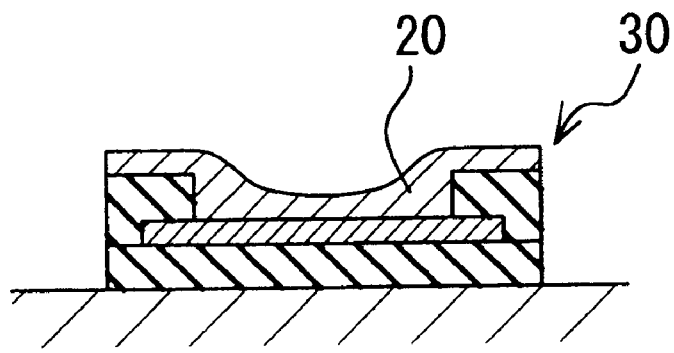

FIGS. 3A to 3C show a process for manufacturing the probe pad 20 and the reinforcing support 30 on the street portion 16 of the silicon wafer 10. According to this process, as shown in FIG. 3A, the lower insulation layer 32, the intermediate metal layer 34, and the upper insulation layer 36' are superimposed one by one in this order. The width of the metal layer 34 is larger than a portion of the reinforcing support 30 to be cut out by dicing, located between the dotted lines 40. Then, as shown in FIG. 3B, a central portion of the upper layer 36', positioned on the central portion of the metal layer 34, is removed to define an extended groove on the metal layer 34 and between the remaining upper insulation layers 36 positioned on the opposite sides of the groove. A width of the groove is larger than that of the dicing region located between the dotted lines 40. Preferably, the groove is extended vertically to expose the top surface of the metal layer 34 as indicated in the drawing. Finally, a suitable metal is deposited by a vapor deposition technique such as sputtering both on the exposed metal layer 34 and on the remaining upper insulation layers 36 to form the probe pad 20 with its bathtub-like top surface. The above process for manufacturing the probe pad is carried out in the formation of the chip portions.

Second Embodiment

Figure 4A:
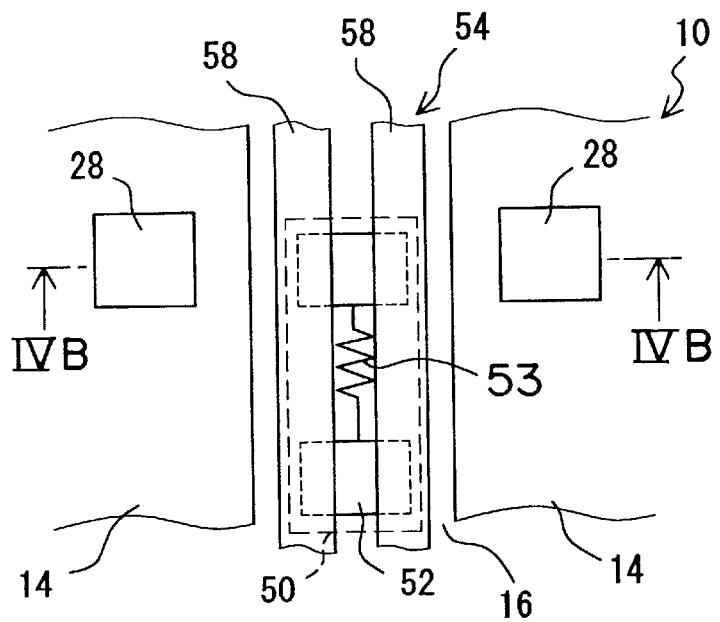
FIG. 4A is a partial, enlarged plan view of the silicon wafer according to the second embodiment of the present invention.
Figure 4B:
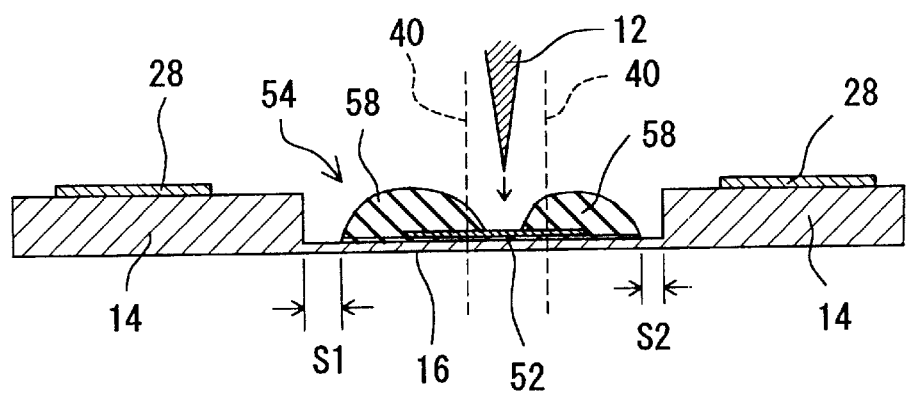
FIG. 4B is an enlarged cross sectional view of the street portion bearing the reinforcing support and the probe pad.
Figure 4C:
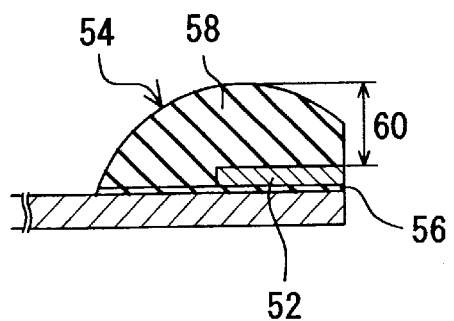
FIG. 4C is an enlarged cross sectional view of a cut edge of the street portion.
Figure 6A:
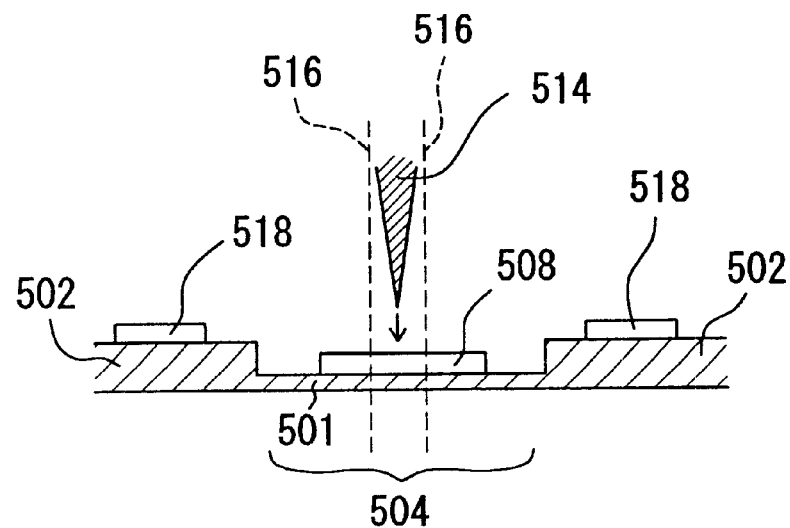
FIG. 6A is an enlarged cross sectional view of the street portion of the silicon wafer in FIG. 5A.
Figure 6B:
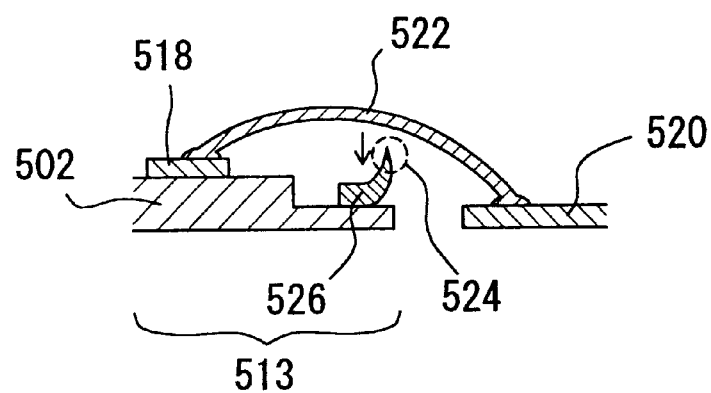
FIG. 6B is an enlarged cross sectional view of the chip portion and the street portion with a burr.
Figure 6C:
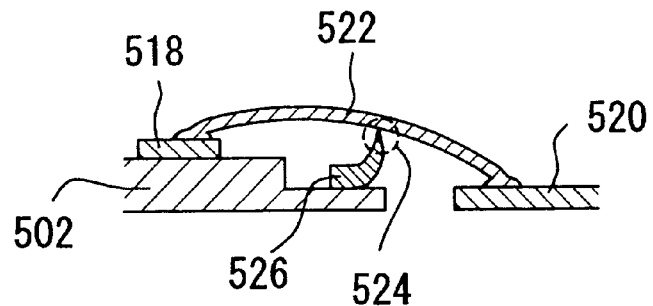
FIG. 6C is an enlarged cross sectional view showing a connection between the burr and the bonding wire.

Referring to FIG. 4A, a silicon wafer 10 bears a test element group (TEG) or resistor circuit 50 on a street portion 16 extending between neighboring chip portions 14. The circuit 50 has a pair of probe pads 52 and a resistance wire 53 connecting between the probe pads 52. In order to minimize a possible deformation of the probe pads 52 by dicing, as best shown in FIG. 4C, a reinforcing support 54 of this embodiment has a lower insulation layer 56 underneath the probe pads 52 and upper insulation layers 58 on the opposite sides of the probe pad 52. Preferably, as shown in FIG. 4A, the reinforcing support 54 is extended along the street 16 to run across the probe pads 52 in the circuit 50. The lower insulation layer 56 is extended out to a certain extent from the outer edges of the probe pad 52. An inner edge of the upper insulation layer 58, which is shaped in the form of mountain, is located within the cutting region 40 by the dicer 12. On the other hand, each of the outer edges of the reinforcing portion 54 is spaced a certain distance S1, S2 away from the adjacent peripheral edge of the chip region 14. This effectively minimizes an amount of vibration to be transmitted to the chip portions 14 at dicing.

As best shown in FIG. 4C illustrating a peripheral edge portion of the street portion remaining after dicing, since the cut edge of the probe pad 52 is fully covered by the upper insulation layer 58, substantially no burr is created at the cut edge of the probe pad 52. Also, the mountain-like upper insulation layer 58 can make a contact with a bonding wire that is extended across and above the upper insulation layer 58 from the bonding pad 28 on the chip portion 14 to another connecting portion or lead not shown. However, this is not problematic because the upper layer 58 is made of insulation material. Although the upper insulation layer 58 has a mountain-like configuration in this embodiment, a height or thickness 60 of the upper insulation layer 58 may be reduced to some extent provided that the insulation layer can substantially prevent the creation of the burrs. This also reduces a thickness of the package of the chip.

What is claimed is:

1. A semiconductor chip having a chip portion and a street adjacent the chip portion comprises:

a lower insulation layer on the street and having a width extending from an edge portion of the street to a side of the chip portion:

a metal layer on the lower insulation layer and having a width extending from the edge portion of the street by a little behind the lower insulation layer:

an upper insulation layer on the lower insulation layer and portions of the metal layer adjacent to the side surface thereof; and an end portion of a circuit on an upper surface of the metal layer and an upper surface of the upper insulation layer.

2. A semiconductor chip in accordance with claim 1, wherein the metal probe pad which is the end of the circuit on an upper surface of the metal layer and an upper surface of the upper insulation layer.

* * * * *

UNITED STATES PATENT AND TRADEMARK OFFICE
CERTIFICATE OF CORRECTION

PATENT NO. : 6,582,085 B2
DATED : June 24, 2003
INVENTOR(S) : Ryuichi Kosugi

It is certified that error appears in the above-identified patent and that said Letters Patent is hereby corrected as shown below:

<u>Title page, Item [54] and Column 1, lines 1-2,</u>
Change, "SEMICONDUCTOR CHIP AND ITS MANUFACTURING METHOD" to -- SEMICONDUCTOR CHIP HAVING A CIRCUIT ON AN ADJACENT STREET PORTION --.

Signed and Sealed this

Seventeenth Day of February, 2004

JON W. DUDAS
*Acting Director of the United States Patent and Trademark Office*